United States Patent
Jung

(10) Patent No.: US 9,305,786 B2
(45) Date of Patent: *Apr. 5, 2016

(54) SEMICONDUCTOR DEVICE AND FABRICATION METHOD

(71) Applicant: SK hynix Inc., Icheon (KR)

(72) Inventor: Yong Sun Jung, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/633,747

(22) Filed: Feb. 27, 2015

(65) Prior Publication Data

US 2015/0170919 A1    Jun. 18, 2015

Related U.S. Application Data

(63) Continuation of application No. 13/717,603, filed on Dec. 17, 2012, now Pat. No. 9,000,528.

(30) Foreign Application Priority Data

Aug. 22, 2012   (KR) ........................ 10-2012-0091823

(51) Int. Cl.
| | |
|---|---|
| *H01L 21/28* | (2006.01) |
| *H01L 21/283* | (2006.01) |
| *H01L 27/108* | (2006.01) |
| *H01L 27/088* | (2006.01) |
| *H01L 23/525* | (2006.01) |

(52) U.S. Cl.
CPC ........ *H01L 21/28008* (2013.01); *H01L 21/283* (2013.01); *H01L 23/5252* (2013.01); *H01L 27/088* (2013.01); *H01L 27/108* (2013.01); *H01L 2924/0002* (2013.01)

(58) Field of Classification Search
CPC ............ H01L 21/28008; H01L 21/283; H01L 23/5252; H01L 27/088; H01L 27/108
See application file for complete search history.

(56) References Cited

U.S. PATENT DOCUMENTS

| | | | |
|---|---|---|---|
| 7,642,138 B2 | 1/2010 | Kurjanowicz | |
| 2002/0102790 A1* | 8/2002 | Kim ............................ | 438/239 |
| 2004/0262679 A1* | 12/2004 | Ohsawa .................. | H01L 21/84 257/331 |
| 2012/0012943 A1 | 1/2012 | Jung | |
| 2012/0091557 A1 | 4/2012 | Lee | |
| 2013/0056837 A1* | 3/2013 | Ng .................. | H01L 21/823807 257/410 |
| 2013/0075824 A1* | 3/2013 | Fukushima et al. .......... | 257/368 |

FOREIGN PATENT DOCUMENTS

| | | |
|---|---|---|
| KR | 10-2012-0006707 A1 | 1/2012 |
| KR | 10-1140106 B1 | 4/2012 |

* cited by examiner

*Primary Examiner* — Whitney T Moore

(57) ABSTRACT

A semiconductor device using a small-sized metal contact as a program gate of an antifuse, and a method of fabricating the same are described. The semiconductor device includes a metal contact structure formed on a semiconductor substrate of a peripheral circuit area, and includes a first gate insulating layer to be ruptured. A gate structure is formed on the semiconductor substrate to one side of the metal contact structure.

14 Claims, 5 Drawing Sheets

SEMICONDUCTOR DEVICE AND FABRICATION METHOD

CROSS-REFERENCE TO RELATED APPLICATION

This application is a continuation of U.S. application Ser. No. 13/717,603 filed on Dec. 17, 2012, which claims priority under 35 U.S.C. 119(a) to Korean application number 10-2012-0091823, filed on 22 Aug. 2012, which is incorporated by reference in its entirety.

BACKGROUND

Embodiments relate to a semiconductor device and a method of fabricating the same, and more particularly, to technology for forming a metal contact having a small size as a program gate of an antifuse.

In recent years, with rapid spread of information media such as computers, semiconductor devices have developed dramatically. In the terms of function, the semiconductor devices may desirably exhibit high speed operation and large storage capacity. Thus, technology for fabricating semiconductor devices has been developed to improve a degree of integration, reliability, and a response speed.

Methods of fabricating the semiconductor devices typically include a fabrication (FAB) process which forms cells having integration circuits, by repeatedly forming preset circuit patterns on a substrate formed of a silicon material. An assembly process packages the substrate in which the cells are formed, in chip-sized units. An electrical die sorting (EDS) process for inspecting electrical characteristics of the cells formed on the substrate, is performed between the FAB process and the assembly process.

The EDS process is a process for determining whether or not the cells formed on the substrate, are in an electrically operational state or in a failed state. The failed cells are removed through the EDS process before performing the assembly process, so that an effort and cost for the assembly process can be saved. Further, the failed cells can be found in advance and repaired through a repair process.

Hereinafter, the repair process will be described in detail.

To improve device yield when defects occur in the semiconductor device fabrication process, redundancy cells configured to replace defected elements or circuits are added. A fuse configured to connect the redundancy cells to an integrated circuit is designed in device design. The location information of cells to be repaired is generated by cutting only specific fuses.

However even when the repair process for repairing defective cells at the wafer level is performed, after a package process 1-bit or 2-bit defects can still occur in the chips which have been not failed in the wafer level. This can lead to a defect rate of about 10% occurring. Therefore, introduction of the repair process after the package process is desirable.

Multi-chip packages may include a plurality of packaged chips. Since a relatively high-priced flash device as well as a dynamic random access memory (DRAM) can be rendered unusable by the 1-bit or 2-bit defect, the introduction of the repair process after the package process is desirable.

However, since the laser repair equipment cannot be used after the package process, a fuse configuration different from that used in the repair process before packaging, is desirable.

Hereinafter, the fuse type used in the repair process after the package process will be described.

The fuse used after the package process is generally referred to as an antifuse. This is because the repair is performed not by cutting the fuse used after the packaging, but instead by a mutual connection of the fuse while the repair is performed by cutting the fuse before the packaging. That is, the antifuse has as meaning relative to the fuse before packaging, and the antifuse is a fuse which is electrically opened in a normal state and short-circuited when an insulator between conductors is broken by voltage application if necessary. The antifuse may be formed in a peripheral circuit area and is typically formed of a static random access memory (SRAM) of a non-refresh type.

The antifuse allows repair at the package level, and may be widely used to increase the net die throughput, improve product characteristics, and overcome the dependence on equipment and a process of the existing laser fuse according to high integration.

Therefore, it is desirable to successfully rupture the antifuse and to ensure reliability.

Further, as the density of a DRAM is increased, the number of fuses required is increased, and thus the overall fuse area size is increased and the net die is reduced.

SUMMARY

One or more exemplary embodiments are provided to a semiconductor device in which a metal contact is formed to serve as a program gate of an antifuse. Methods of fabricating the same are also disclosed.

According to one aspect of an exemplary embodiment, there is provided a semiconductor device. The semiconductor device may include: a metal contact structure formed on a semiconductor substrate of a peripheral circuit area and including a first gate insulating layer having a first thickness configured to be ruptured; and a gate structure formed on the semiconductor substrate at one side of the metal contact structure.

The semiconductor device further includes a first metal contact formed on a first junction region at one side of the gate structure. The first metal contact includes a bit line contact.

The metal contact structure includes the first gate insulating layer, a second metal contact formed on the first gate insulating layer, and a metal interconnection formed on the second metal contact. The first gate insulating layer is formed on a second junction region of the semiconductor substrate at the one side of the gate structure.

The gate structure includes a second gate insulating layer formed on the semiconductor substrate to the second thickness, a conductive layer formed on the second gate insulating layer, and a hard mask nitride layer formed on the conductive layer.

The first gate insulating layer has the first thickness smaller than the second thickness of the second gate insulating layer. The first gate insulating layer has the second thickness of between about 20 to 30 Å.

The second gate insulating layer has the first thickness of between about 50 to 60 Å. The second thickness is the same as a gate insulating layer thickness in a cell area of the semiconductor device. The channel is configured to be formed below the second gate insulating layer when the first gate insulating layer is ruptured. The metal contact structure is driven as a program gate and the gate structure is driven as a select gate.

According to another aspect of an exemplary embodiment, there is provided a method of fabricating a semiconductor device. The method may include: forming a metal contact structure including a first gate insulating layer on the semiconductor substrate at one side of each of the gate structures.

The method may further include performing impurity ion implantation on the semiconductor substrate using the gate structure as a mask, to form a first junction region between the gate structure and a second junction region at an outer side of each of the gate structures.

The method may further include forming a first metal contact on the first junction region. The forming a metal contact structure includes forming the first gate insulating layer on the semiconductor substrate, and forming a second metal contact on the first gate insulating layer. The first gate insulating layer is formed on the second junction region.

The forming gate structures includes forming a second gate insulating layer on the semiconductor substrate, forming a conductive layer on the second gate insulating layer, and forming a hard mask nitride layer on the conductive layer.

The first gate insulating layer is formed to be thinner than the second gate insulating layer. The first gate insulating layer is formed to have the same thickness as a gate insulating layer of a cell area.

The first gate insulating layer is formed to have a thickness of between about 20 to 30 Å and the second gate insulating layer is formed to have a thickness of between about 50 to 60 Å.

According to another aspect of an exemplary embodiment, there is provided a semiconductor device. The semiconductor device may include: a metal contact structure formed on a semiconductor substrate of a peripheral circuit area and including a first gate insulating layer configured to be ruptured when a first voltage is applied; a first gate structure formed on the semiconductor substrate at one side of the metal contact structure, and in which a channel region is configured to be formed below the first gate structure when a second voltage is applied; a second gate structure formed on the semiconductor substrate at one side of the first gate structure and to which a third voltage is applied; and a second metal contact structure formed on the semiconductor substrate at one side of the second gate structure and to which the third voltage is applied.

The semiconductor device may further include a metal contact formed between the first gate structure and the second gate structure. The first voltage is a high voltage, the third voltage is a low voltage, and the second voltage is between the first voltage and the third voltage; a metal contact structure formed on a semiconductor substrate of a peripheral circuit area and including a first gate insulating layer configured to be ruptured when a first voltage is applied; a first gate structure formed on the semiconductor substrate at one side of the metal contact structure and in which a channel region is configured to be formed below the first gate structure when a second voltage is applied; a second gate structure formed on the semiconductor substrate at one side of the first gate structure and to which a third voltage is applied; and a second metal contact structure formed on the semiconductor substrate at one side of the second gate structure and to which the third voltage is applied.

The semiconductor device may further include a metal contact formed between the first gate structure and the second gate structure.

The first voltage may be a high voltage, the third voltage may be a low voltage, and the second voltage may be between the first voltage and the third voltage.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
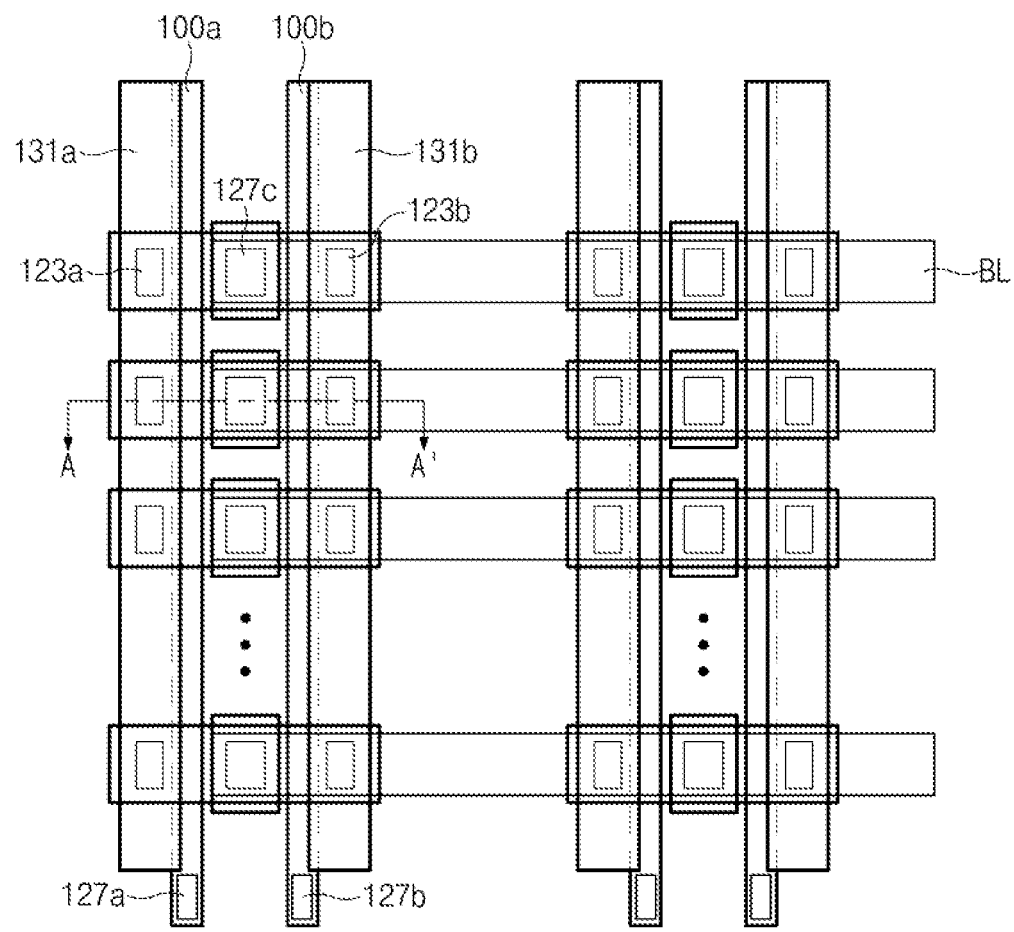
FIG. 1 is a plan view illustrating an antifuse according to exemplary embodiments.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, some variation from the shapes of the illustrations (for example as a result of manufacturing techniques and/or tolerances) are possible. Thus, exemplary embodiments should not be construed as limited to the particular shapes of regions illustrated herein, but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

An antifuse array comprises a program transistor, a selector transistor, and a metal contact which are arranged in plural numbers. One program transistor, one select transistor, and one bit line (one metal contact) are selected to program an arbitrarily selected cell.

When a high voltage is applied to a program gate, a gate insulating layer of the program transistor is ruptured by a level difference between the high voltage and a low voltage applied through a bit line. A constant voltage is applied to a select gate and a channel region is formed below the select gate. Thus the high voltage applied to the program voltage is output through the bit line (metal contact) at one side of the select gate via the channel region below the select gate.

In the exemplary embodiment, a small-sized metal contact is formed instead of the program gate and thus a net die of a fuse size is increased.

Further, the gate insulating layer of the program transistor of the antifuse is to be formed thinly, so that the gate insulating layer is easily broken down or ruptured and a gate insulating layer of the select transistor may be formed to above a predetermined thickness to obtain reliability.

To form the gate insulating layers of the program transistor and select transistor with different thicknesses, a process of forming the gate insulating layer of the program transistor and a process of forming the insulating layer of the select transistor are performed separately. Since a mask margin for the processes of forming the gate insulating layers have to be formed, a space corresponding to the mask margin is necessary between the program gate and the select transistor.

Thus, in the exemplary embodiment, instead of the program gate, the small-sized metal contact is formed to satisfy the net die. The gate insulating layer is formed below the metal contact after forming the select gate, so that the gate insulating layer of the select gate is thickly formed, and the gate insulating layer used as the program gate below the metal contact is thinly formed. Therefore breakdown of the gate insulating layer below the metal contact is easily caused, and reliability of the select transistor is increased.

Ion implantation regions (source/drain regions) partially overlapping the gate, are formed at both sides of the gate so that the channel regions are formed below the program gate and select gate of the antifuse. If the gate insulating layer on the channel region is ruptured when the gate insulating layer of the program transistor of the antifuse is ruptured, a current-voltage curve of the N type gate pattern and the P type semiconductor substrate exhibits a diode characteristic, and gate resistance is increased so that a breakdown voltage level becomes unstable when the gate insulating layer is ruptured.

In the exemplary embodiment, instead of a program gate, the gate insulating layer, the metal contact, and the metal interconnection are formed on a source/drain region. This source/drain region shared by the program transistor and the select transistor. This causes the gate insulating layer on the source/drain region shared by the program transistor and the select transistor, to be ruptured. Therefore a difference between the breakdown voltage levels is reduced, to cause the antifuse to be stably operated.

Hereinafter, exemplary embodiments are described in detail with reference to FIGS. 1 to 3F.

Figure 2:
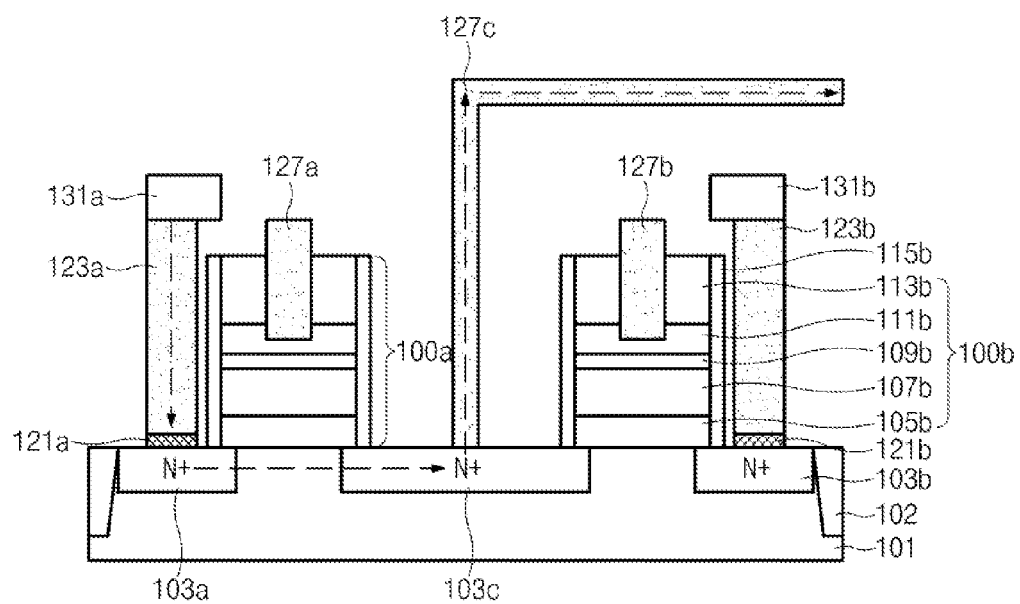
FIG. 2 is a cross-sectional view illustrating an antifuse according to exemplary embodiments.

FIG. 1 is a plan view of an antifuse according to exemplary embodiments, and FIG. 2 is a cross-sectional view of the antifuse taken along line A-A' of FIG. 1.

As shown in FIG. 1, bit lines BL are arranged to be spaced at intervals in a lateral direction, and metal interconnections 131a and 131b and select gate structures 100a and 100b are arranged in a longitudinal direction to cross the bit lines BL. On the basis of the metal contact 127c, the metal interconnection 131a and the select gate structure 100a are arranged at one side of the metal contact 127c in parallel to each other, and the select gate structure 100b and the metal interconnection 131b are arranged at the other side of the metal contact 127c in parallel to each other. Thus, the metal interconnections and the select gate structures are symmetrically arranged bilaterally on the basis of the metal contact 127c. Here, the metal contact 127c serves as a bit line contact connected to the bit line.

The metal interconnections 131a and 131b are connected to metal contacts 123a and 123b formed on each side of the select gate structures 100a and 100b, respectively.

A structure of the antifuse according to the exemplary embodiment will be described in detail with reference to FIG. 2 which is a cross-sectional view taken along line A-A' of FIG. 1, as well as FIGS. 3A-3F showing an embodiment of a method of fabricating an antifuse.

Gate insulating layers 105a and 105b, conductive layers 107a and 107b, barrier layers 109a and 109b, tungsten silicide 111a and 111b, and hard mask nitride layers 113a and 113b, are sequentially formed on a peripheral circuit area of a semiconductor substrate 101 Gate patterning is performed on the layers through a gate etching process to form the select gate structures 100a and 100b.

Metal contact structures are formed to one side of the select gate structures 100a and 100b. The metal contact structures have the gate insulating layers 121 and 121b and the metal contacts 123a and 123b sequentially stacked. The gate insulating layers 121a and 121b are thinly formed, so that a thickness of the gate insulating layers 121a and 121b is less than or equal to a one-half a thickness of the gate insulating layers 105a and 105b of the select gate structures 100a and 100b. The gate insulating layers 121a and 121b are formed on junction regions 103a and 103b.

The metal contact 127 connected to the bit line is formed on a junction region 103c between the select gate structures 100a and 100b.

As described above, in the exemplary embodiment, the antifuse has a structure in which the metal interconnections and the select gates are symmetrically formed bilaterally on the basis of the metal contact 127c.

Operation of the antifuse having the above-described structure will be described below.

First, when the gate insulating layer 121a is ruptured by applying a high voltage through the metal interconnection 131a formed on the metal contact 123a used as the program gate, a channel region is formed between the junction regions 103a and 103c below the select gate 100a by a constant voltage applied through the metal contact 127a on the select gate 100a. A current flows through the channel region and thus the current flows to the metal contact 127c (see the arrow of FIG. 2).

A lower voltage is applied to the other select gate structure 100b which is not selected.

In the antifuse having a structure using the metal contact instead of the program gate, the underlying gate insulating layers 121a and 121b below the respective metal contacts are thinly formed to cause the fuse to be easily ruptured. The gate insulating layers 105a and 105b of the select gate structures are thickly formed to prevent characteristics of the select gates from being degraded.

Hereinafter, a method of fabricating an antifuse according to exemplary embodiments will be described with reference to FIGS. 3A to 3F.

Figure 3A:
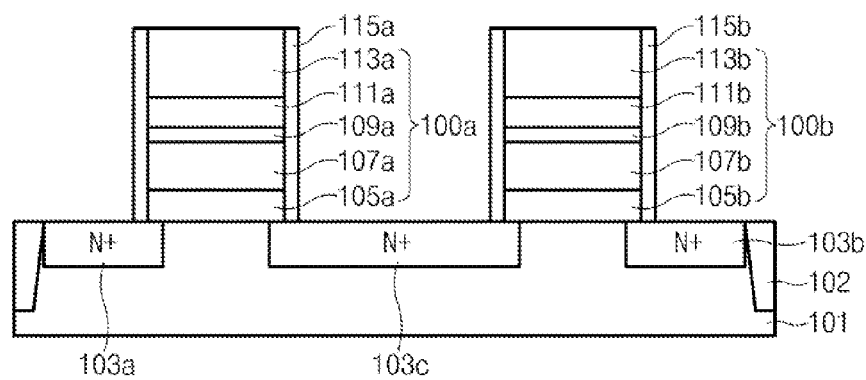
FIGS. 3A to 3F are cross-sectional views illustrating a method of fabricating an antifuse according to exemplary embodiments.

First, as shown in FIG. 3A, a device isolation layer 102 are formed in a semiconductor substrate 101 to isolate an active region and a field region. A photoresist pattern (not shown) for a gate structure is formed on the semiconductor substrate 101. A gate insulating layer, a conductive layer, a barrier layer, a tungsten silicide layer, and a hard mask nitride layer, are sequentially formed on the semiconductor substrate 101. Gate patterning is then performed on the layers through a gate etching process, to form select gate structures 100a and 100b. These select gate structures comprise gate insulating layers 105a and 105b, conductive layers 107a and 107b, barrier layers 109a and 109b, tungsten silicides 111a and 111b, and hard mask nitride layers 113a and 113b sequentially stacked.

Next, a nitride layer is formed on the semiconductor substrate including the select gate structures 100a and 100b. The nitride layer is then etched to form spacers 115a and 115b on sidewalls of the select gate structures 100a and 100b.

The gate insulating layers 105a and 105b may be formed by implanting nitrogen ($N_2$) ions into the active region and performing thermal oxidation. The gate oxide layers 105a and 105b may be formed to have a thickness of between about 50 to 60 Å. The conductive layers 107a and 107b may comprise a material such as polysilicon.

Here, the select gate structures 100a and 100b are formed to be spaced at preset intervals in plural numbers and serve as a select gate for selecting a cell.

Next, impurities are ion-implanted into the exposed active region using the select gate structures 100a and 100b as a mask, to form junction regions 103a to 103c serving as source/drain regions.

Figure 3B:
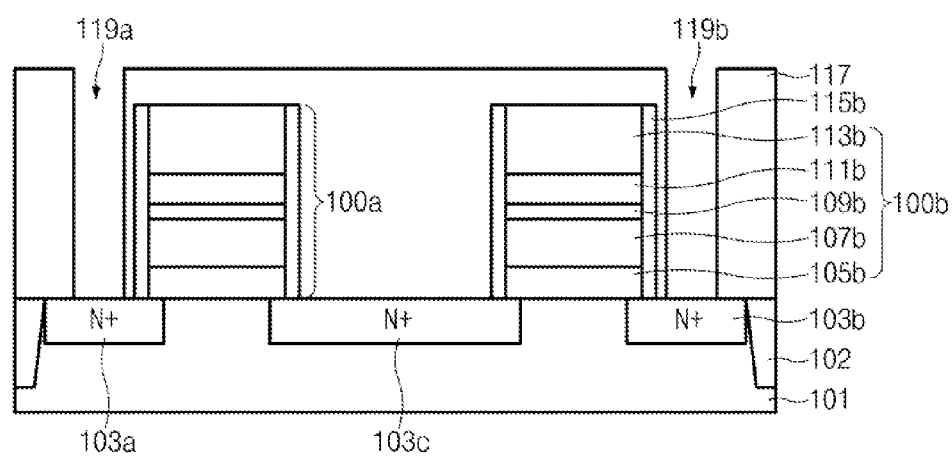

As shown in FIG. 3B, an interlayer insulating layer 117 is formed on the semiconductor substrate 101 including the select gate structures 100a and 100b. A photoresist pattern (not shown) is formed and the interlayer insulating layer 117 is etched using the photoresist pattern as a mask to expose the junction regions 103a and 103b. Thus metal contact holes 119a and 119b are formed are formed on the junction regions 103a and 103b at outer sides of the select gate structures 100a and 100b.

The interlayer insulating layer 117 may comprise an oxide layer. The oxide layer may include one or more materials selected from a high density plasma (HDP) oxide layer, a boron phosphorus silicate glass (BPSG) layer, a phosphorus silicate glass (PSG) layer, a boron silicate glass (BSG) layer, a tetra ethyl ortho silicate (TEOS) layer, an un-doped silicate glass (USG) layer, a fluorinated silicate glass (FSG) layer, a carbon doped oxide (CDO) layer, and an organo silicate glass (OSG) layer. The interlayer insulating layer 117 may comprise a stacked layer including at least two of the above layers. The interlayer insulating layer 117 may include a layer such as a spin on dielectric (SOD) layer coated by spin coating method.

Figure 3C:
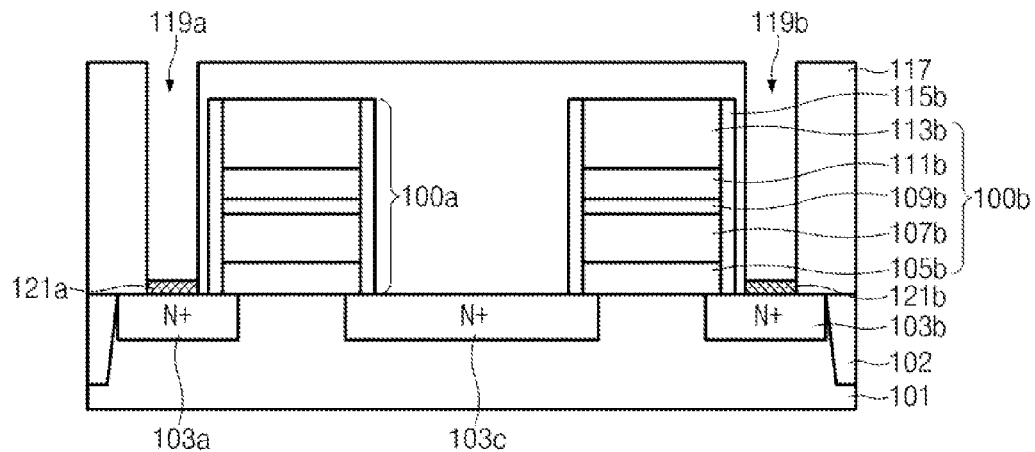

As shown in FIG. 3C, gate insulating layers 121a and 121b are formed on the exposed semiconductor substrate (active region), at the bottom of the metal contact holes 119a and 119b.

Gate insulating layers 121a and 121b may be formed by implanting nitrogen ($N_2$) ions into the exposed active region and performing thermal oxidation. The gate insulating layers 121a and 121b may comprise a nitride layer and/or an oxide layer. The gate insulating layers 121a and 121b may be formed to have a thickness of between about 20 to 30 Å.

Figure 3D:
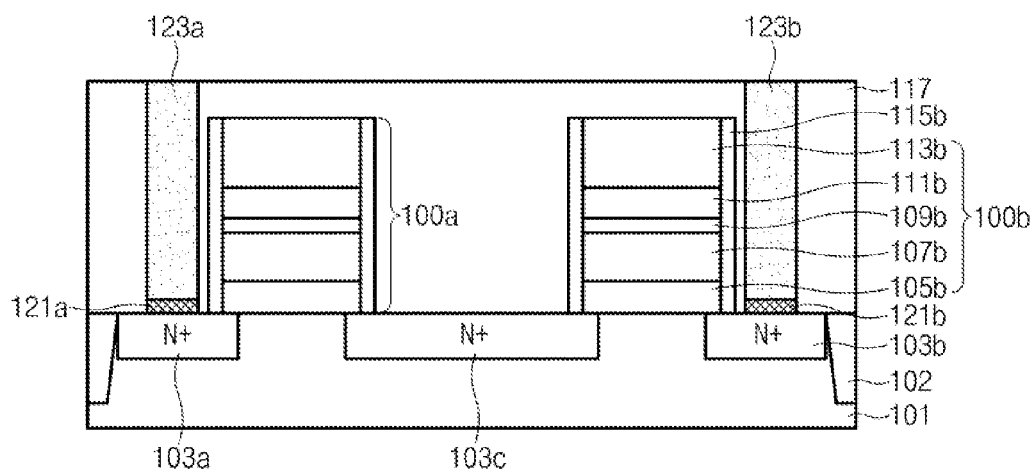

As shown in FIG. 3D, a conductive material is formed to fill the metal contact holes 119a and 119b on the gate insulating layers 121a and 121b. The conductive material is planarized to expose an upper surface of the interlayer insulating layer 117 to form metal contacts 123a and 123b. Planarization may be performed through a chemical mechanical polishing (CMP) process, or the like.

Figure 3E:
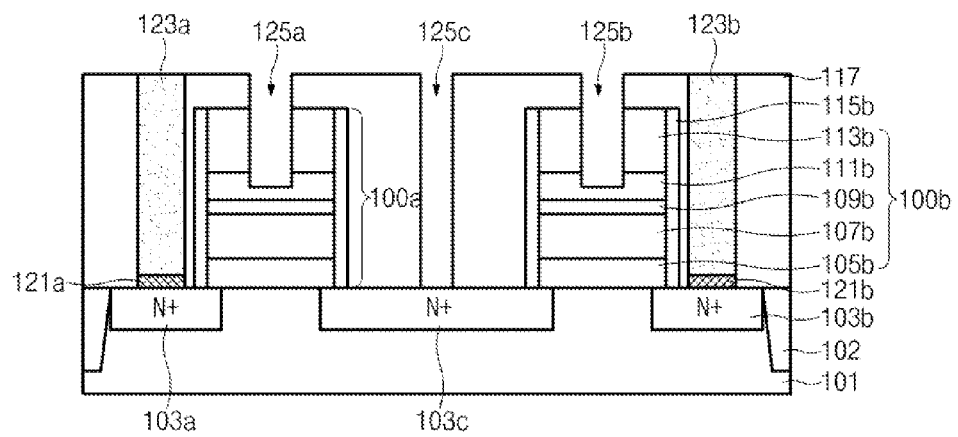

As shown in FIG. 3E, the interlayer insulating layer 117 on the select gate structures 100a and 100b, the hard mask nitride layers 113a and 113b, and the tungsten silicides 111a and 111b, are etched to form metal contact holes 125a and 125b. Simultaneously, the interlayer insulating layer 117 on the junction region 103c between the select gate structures 100a and 100b is etched to form a metal contact hole 125c exposing the junction region 103c.

Figure 3F:
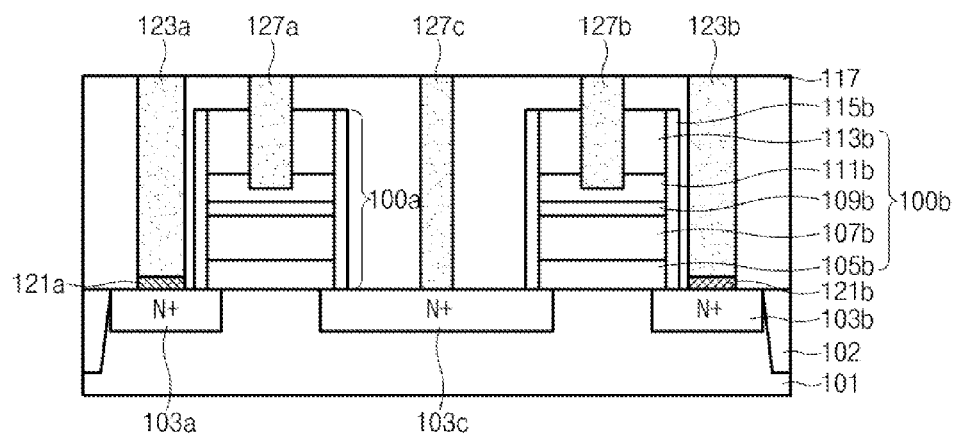

As shown in FIG. 3F, a conductive material is deposited on the interlayer insulating layer 117 to fill the metal contact holes 125a to 125c formed in FIG. 3E. The conductive material is planarized to expose the upper surface of the interlayer insulating layer 117, thereby forming metal contacts 127a to 127c.

As described above, in the exemplary embodiment, the metal contacts 123a and 123b are formed instead of a program gate of the antifuse, in order to reduce a fuse size. The gate insulating layers 121a and 121b below the metal contacts 123a and 123b are thinly formed. Metal contacts 123a and 123b are driven as the program gate to cause the fuse to be easily ruptured. The gate insulating layers 105a and 105b of the select gate structures 100a and 100b used as the select gate, are thickly formed to improve reliability of the select transistor.

Further, the gate insulating layers 121a and 121b below the metal contacts 123a and 123b used as the program gate, are formed on the junction regions 103a and 103b. As a result, breakdown is caused only on the junction regions 103a and 103b and thus instability of the breakdown voltage level is solved.

According to the exemplary embodiments, one or more effects may be realized as follows.

First, a small-sized metal contact replaces a program gate to reduce a fuse size.

Secondly, a gate insulating layer below the metal contact used as the program gate is thinly formed, and a gate insulating layer below a select gate is thickly formed. Thus, breakdown of the program gate can be readily obtained and while reliability of the select transistor can be improved.

Thirdly, the gate insulating layer and the metal contact are formed on a source/drain region after ion implantation for the source/drain region. Thus, breakdown on the source/drain region is caused to solve instability of breakdown current.

The above embodiment is illustrative and not limitative. Various alternatives and equivalents are possible. Nor are embodiments limited to any specific type of semiconductor device. Other additions, subtractions, or modifications are obvious in view of the present disclosure and are intended to fall within the scope of the appended claims.

What is claimed is:

1. A method of fabricating a semiconductor device, the method comprising:
    forming a plurality of gate structures on a semiconductor substrate, each of the gate structures being a select gate;
    forming a plurality of junction regions in the semiconductor substrate; and
    forming a metal contact structure including a first metal contact and a first gate insulating layer on the semiconductor substrate at one side of each of the gate structures, the metal contact structure being a program gate,
    wherein the first gate insulating layer is formed between the first metal contact and a corresponding junction region.

2. The method of claim 1, wherein the corresponding junction region is a first junction region, and
    wherein forming the junction regions includes performing impurity ion implantation on the semiconductor substrate using the gate structures as a mask, to form a second junction region between adjacent gate structures and the first junction region at an outer side of each of the gate structures.

3. The method of claim 2, further comprising forming a second metal contact on the second junction region.

4. The method of claim 3, wherein the first metal contact includes a bit line contact.

5. The method of claim 3, wherein forming the second metal contact includes:
    forming a metal contact hole on the second junction region; and
    forming a conductive material within the metal contact hole.

6. The method of claim 2, wherein forming the metal contact structure includes forming the first metal contact on the first junction region.

7. The method of claim 6, wherein forming the first metal contact includes:
    forming a metal contact hole on the first junction region;
    forming the first gate insulating layer on the semiconductor substrate at a bottom portion of the metal contact hole; and
    forming a conductive material within a remaining portion of the metal contact hole.

8. The method of claim 1, wherein forming the gate structures includes:
    forming a second gate insulating layer on the semiconductor substrate;
    forming a conductive layer on the second gate insulating layer; and
    forming a hard mask nitride layer on the conductive layer.

9. The method of claim 8, wherein the first gate insulating layer is formed to be thinner than the second gate insulating layer.

10. The method of claim 8, wherein the first gate insulating layer is formed to have the same thickness as a gate insulating layer of a cell area.

11. The method of claim 8, wherein the first gate insulating layer is formed to have a thickness of between about 20 to 30 Å and the second gate insulating layer is formed to have a thickness of between about 50 to 60 Å.

12. The method of claim 1, further comprising:
forming a metal interconnection on the first metal contact.

13. The method of claim 1, wherein the first gate insulating layer is disposed directly on the corresponding junction region.

14. The method of claim 1, wherein the first gate insulating layer and the first metal contact are aligned in a direction perpendicular to a top surface of the semiconductor substrate.

* * * * *